(12) United States Patent
Lam et al.

(10) Patent No.: US 10,871,909 B2
(45) Date of Patent: Dec. 22, 2020

(54) BLOCK MANAGEMENT METHOD, MEMORY CONTROL CIRCUIT UNIT AND APPARATUS USING MAPPING TABLES AND BLOCK RECOGNITION MACHINE LEARNING WITH BLOCK PARAMETERS AS TRAINING DATA

(71) Applicant: PHISON ELECTRONICS CORP., Miaoli (TW)

(72) Inventors: Siu-Tung Lam, Hsinchu (TW); Ming-Yen Lee, Miaoli County (TW); Kuo-Lung Lee, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/956,749

(22) Filed: Apr. 19, 2018

(65) Prior Publication Data
US 2019/0278480 A1 Sep. 12, 2019

(30) Foreign Application Priority Data
Mar. 6, 2018 (TW) ............................. 107107330 A (51) Int. Cl.
*G06F 3/06* (2006.01)
*G06F 12/02* (2006.01)
(Continued)

(52) U.S. Cl.
CPC ............ *G06F 3/064* (2013.01); *G06F 3/0659* (2013.01); *G06F 3/0679* (2013.01);
(Continued)

(58) Field of Classification Search
CPC ...... G06F 3/064; G06F 3/0659; G06F 3/0679; G06F 11/1044; G06F 11/106;
(Continued)

(56) References Cited

U.S. PATENT DOCUMENTS 8,031,827 B2 * 10/2011 Tsai ..................... G11C 19/28
377/64
8,296,507 B2 * 10/2012 Yeh ..................... G06F 12/0246
711/103
(Continued)

FOREIGN PATENT DOCUMENTS

CN  103366809  10/2013
CN  105339913  2/2016
(Continued)

*Primary Examiner* — Glenn Gossage
(74) *Attorney, Agent, or Firm* — JCIPRNET (57) ABSTRACT

A block management method, a memory control circuit unit and a memory storage apparatus for managing a plurality of physical blocks are provided. The method includes writing test data to a first physical block among the plurality of physical blocks, reading the test data from the first physical block among the plurality of physical blocks to obtain a plurality of parameters corresponding to the first physical block; grouping the first physical block into a first block group or a second block group according to the plurality of parameters corresponding to the first physical block and a rule between the plurality of parameters and grouping of the plurality of physical blocks; establishing first and second block mapping tables; and mapping logical addresses of the first and second block mapping tables to the plurality of physical blocks belonging to the first and second block groups. The parameters may comprise at least one of a read busy time parameter, a storage retention parameter, and a bit error position parameter. The bit error position parameter may be obtained according to an error bits distribution in upper, center and lower physical programming units. A usage status may be determined according to the parameters, and blocks with a usage status of good may be used first to evenly use all the plurality of physical blocks.

18 Claims, 7 Drawing Sheets

(51) Int. Cl.
  *G06F 11/10*  (2006.01)
  *G11C 29/52* (2006.01)
  *G06N 20/00* (2019.01)
(52) U.S. Cl.
  CPC ........ *G06F 11/106* (2013.01); *G06F 11/1044* (2013.01); *G06F 12/0246* (2013.01); *G06N 20/00* (2019.01); *G11C 29/52* (2013.01); *G06F 2212/7201* (2013.01)
(58) Field of Classification Search
  CPC ......... G06F 12/0246; G06F 2212/7201; G11C 29/52; G06N 20/00
  See application file for complete search history.

(56) References Cited

U.S. PATENT DOCUMENTS

| | | | | |
|---|---|---|---|---|
| 9,098,395 | B2* | 8/2015 | Yeh | G06F 12/0246 |
| 9,164,891 | B2* | 10/2015 | Karamcheti | G06F 3/061 |
| 2009/0172255 | A1* | 7/2009 | Yeh | G06F 12/0246 711/103 |
| 2009/0282305 | A1* | 11/2009 | Chen | G06F 11/1068 714/718 |
| 2010/0174851 | A1* | 7/2010 | Leibowitz | G06F 3/0616 711/103 |
| 2012/0185740 | A1* | 7/2012 | Hsu | G06F 11/1048 714/719 |
| 2012/0216085 | A1* | 8/2012 | Weingarten | G11C 29/028 714/718 |
| 2013/0179627 | A1* | 7/2013 | Yeh | G06F 3/0656 711/103 |
| 2013/0262751 | A1* | 10/2013 | Kwak | G11C 16/3495 711/103 |
| 2013/0304965 | A1* | 11/2013 | Yeh | G06F 12/0246 711/103 |
| 2014/0226412 | A1* | 8/2014 | Yeh | G11C 11/5628 365/185.21 |
| 2016/0170871 | A1* | 6/2016 | Hyun | G06F 3/0679 711/103 |
| 2016/0180959 | A1* | 6/2016 | Darragh | G06F 3/0653 365/185.09 |
| 2017/0345489 | A1* | 11/2017 | Zeng | G06F 11/1048 |
| 2017/0372229 | A1* | 12/2017 | Ura | G06N 20/00 |
| 2018/0143762 | A1* | 5/2018 | Kim | G11C 16/3431 |
| 2018/0357535 | A1* | 12/2018 | Shulkin | G06N 3/08 |
| 2019/0108888 | A1* | 4/2019 | Sarkar | G11C 16/349 |
| 2019/0156195 | A1* | 5/2019 | Gervais | G06N 3/08 |

FOREIGN PATENT DOCUMENTS

| | | |
|---|---|---|
| TW | 200947450 | 11/2009 |
| TW | 201102827 | 1/2011 |

\* cited by examiner

BLOCK MANAGEMENT METHOD, MEMORY CONTROL CIRCUIT UNIT AND APPARATUS USING MAPPING TABLES AND BLOCK RECOGNITION MACHINE LEARNING WITH BLOCK PARAMETERS AS TRAINING DATA

CROSS-REFERENCE TO RELATED APPLICATION

This application claims the priority benefit of Taiwan application serial no. 107107330, filed on Mar. 6, 2018. The entirety of the above-mentioned patent application is hereby incorporated by reference herein and made a part of this specification.

BACKGROUND

Technical Field

The invention relates to a block management method, a memory control circuit unit and a memory storage apparatus, and more particularly, relates to a block management method based on machine learning, a memory control circuit unit and a memory storage apparatus using the method.

Description of Related Art

The markets of digital cameras, cellular phones, and MP3 players have expanded rapidly in recent years, resulting in escalated demand for storage media by consumers. The characteristics of data non-volatility, low power consumption, compact size and non-mechanical structure make a rewritable non-volatile memory module (e.g., a flash memory) ideal to be built in the portable multi-media devices as cited above.

A flash memory is usually partitioned into a plurality of physical blocks. In general, a physical block is the minimum unit for erasing in the flash memory. That is to say, each of the physical blocks includes a minimum number of memory units to be erased together. Each of the physical blocks is usually partitioned into a plurality of physical pages. The physical page is usually the minimum unit for programming. In other words, the physical page is the minimum unit for writing data or reading data.

When a flash memory storage apparatus is used as a storage medium for an operating system installed in a computer, the operating system will regularly access specific data, such as File Allocation Table (abbreviated as FAT). Under the aforesaid operating system, the physical blocks of the flash memory storage apparatus will be frequently erased in order to complete updating for the data. However, an erase count of the physical block is limited (e.g., the physical block will be damaged after being erased over 10,000 times), and thus the lifetime of the flash memory storage apparatus will be significantly reduced if the physical blocks are frequently erased.

Normally, the aforesaid operating system stores data on the storage apparatus by a specific usage pattern. For example, wearing levels of certain physical blocks may be overly high while the wearing levels of some other physical blocks are overly low. Therefore, if different writing mechanisms may be designed according to the wearing level of each of the physical blocks, performance of the flash memory storage apparatus may be effectively improved to extend the lifetime of the flash memory storage apparatus. In view of the above, persons skilled in the art need to continuously develop a block management method for evenly using all the physical blocks of a flash memory storage system to effectively extend the lifetime of the flash memory storage system.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a memory managing method, a memory control circuit unit and a memory storage apparatus.

An exemplary embodiment of the invention is directed to a block management method for managing a plurality of physical blocks in a rewritable non-volatile memory module. The block management method includes: writing test data to a first physical block among the plurality of physical blocks; reading the test data from the first physical block among the physical blocks to obtain a plurality of parameters corresponding to the first physical block; grouping the first physical block into a first block group or a second block group according to the plurality of parameters corresponding to the first physical block and a rule between the plurality of parameters and grouping of the plurality of physical blocks; establishing a first block mapping table and a second block mapping table; mapping logical addresses of the first block mapping table to the physical blocks belonging to the first block group; and mapping logical addresses of the second block mapping table to the physical blocks belonging to the second block group. The plurality of parameters comprises a bit error position parameter that is obtained according to an error bits distribution in an upper physical programming unit, an error bits distribution in a center physical programming unit and an error bits distribution in a lower physical programming unit among test data read from each of the plurality of physical blocks. The rule between the plurality of parameters and the grouping of the plurality of physical blocks comprises: grouping a physical block of the plurality of physical blocks into the first block group when test data read from the physical block is correctable in an error checking and correcting operation, and grouping a further physical block of the plurality of physical blocks into the second block group when further test data read from the further physical block is uncorrectable in the error checking and correcting operation and is corrected after a re-reading operation.

An exemplary embodiment of the invention is directed to a memory storage apparatus, which includes a connection interface unit, a rewritable non-volatile memory module and a memory control circuit unit. The connection interface unit is configured to electrically connect to a host system. The rewritable non-volatile memory module includes a plurality of physical blocks. The memory control circuit unit is electrically connected to the connection interface unit and the rewritable non-volatile memory module. The memory control circuit unit is configured to give a write command sequence for writing test data into a first physical block among the plurality of physical blocks. The memory control circuit unit is configured to give a read command sequence for reading the test data from the first physical block among the physical blocks to obtain a plurality of parameters corresponding to the first physical block. The memory control circuit unit is configured to group the first physical block into a first block group or a second block group according to the plurality of parameters corresponding to the first physical block and a rule between the plurality of parameters and grouping of the plurality of physical blocks. In addition, the memory control circuit unit is configured to establish a first block mapping table and a second block mapping table; map logical addresses of the first block mapping table to the physical blocks belonging to the first block group; and map logical addresses of the second block mapping table to the physical blocks belonging to the second block group. The plurality of parameters comprises a bit error position parameter that is obtained according to an error bits distribution in an upper physical programming unit, an error bits distribution in a center physical programming unit and an error bits distribution in a lower physical programming unit among test data read from each of the plurality of physical blocks. The rule between the plurality of parameters and the grouping of the plurality of physical blocks comprises: grouping a physical block of the plurality of physical blocks into the first block group when test data read from the physical block is correctable in an error checking and correcting operation and grouping a further physical block of the plurality of physical blocks into the second block group when further test data read from the further physical block is uncorrectable in the error checking and correcting operation and is corrected after a re-reading operation.

An exemplary embodiment of the invention is directed to a memory control circuit unit, which includes a host interface, a memory interface and a memory management circuit. The host interface is configured to electrically connect to a host system. The memory interface is configured to electrically connect to a rewritable non-volatile memory module, and the rewritable non-volatile memory module includes a plurality of physical blocks. The memory management circuit is electrically connected to the host interface and the memory interface. The memory management circuit is configured to give a write command sequence for writing test data to a first physical block among the plurality of physical blocks and to give a read command sequence for reading the test data from the first physical block among the physical blocks to obtain a plurality of parameters corresponding to the first physical block. Further, the memory management circuit is configured group the first physical block into a first block group or a second block group according to the plurality of parameters corresponding to the first physical block and a rule between the plurality of parameters and grouping of the plurality of physical blocks. The memory management circuit is configured to establish a first block mapping table and a second block mapping table. The memory management circuit is configured to map logical addresses of the first block mapping table to the physical blocks belonging to the first block group. The memory management circuit is configured to map logical addresses of the second block mapping table to the physical blocks belonging to the second block group. The plurality of parameters comprises a bit error position parameter that is obtained according to an error bits distribution in an upper physical programming unit, an error bits distribution in a center physical programming unit and an error bits distribution in a lower physical programming unit among test data read from each of the plurality of physical blocks. The rule between the plurality of parameters and the grouping of the plurality of physical blocks comprises: grouping a physical block of the plurality of physical blocks into the first block group when test data read from the physical block is correctable in an error checking and correcting operation and grouping a further physical block of the plurality of physical blocks into the second block group when further test data read from the further physical block is uncorrectable in the error checking and correcting operation and is corrected after a re-reading operation.

Based on the above, with the block management method, the memory control circuit unit and the memory storage apparatus of the invention, a usage status of the physical block may be determined according to the parameters of the physical block and the physical block may be grouped accordingly. As a result, the physical blocks with the usage status being good may be used first to achieve the purpose of evenly using all the physical blocks in the flash memory storage system.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage apparatus (a.k.a. a memory storage system) includes a rewritable non-volatile memory module and a controller (a.k.a. a control circuit unit). The memory storage apparatus is usually configured together with a host system so the host system can write data into the memory storage apparatus or read data from the memory storage apparatus.

Figure 1:
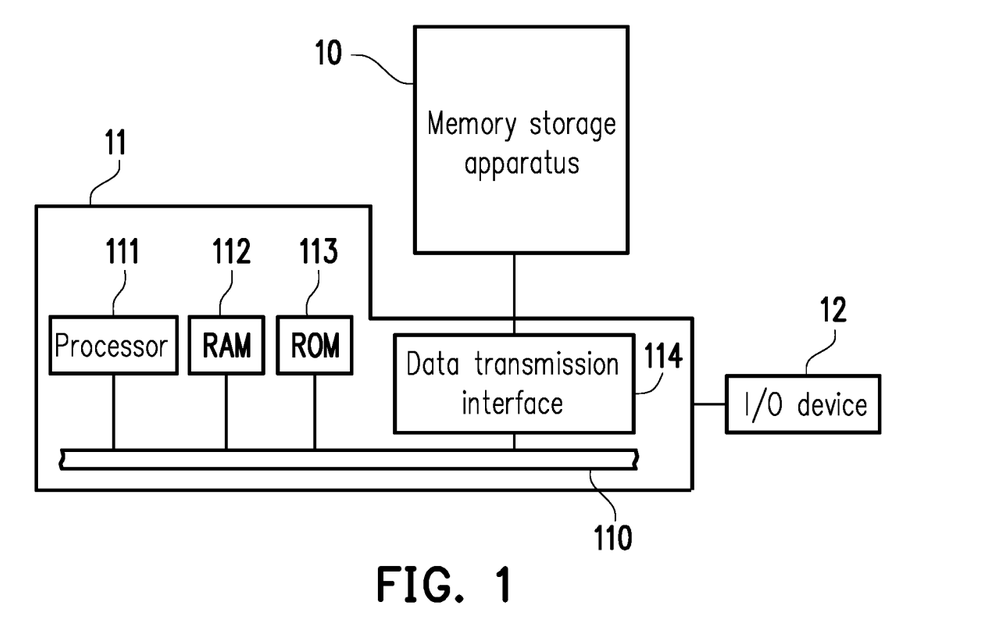
FIG. 1 is a schematic diagram illustrating a host system, a memory storage apparatus and an input/output (I/O) device according to an exemplary embodiment.
Figure 2:
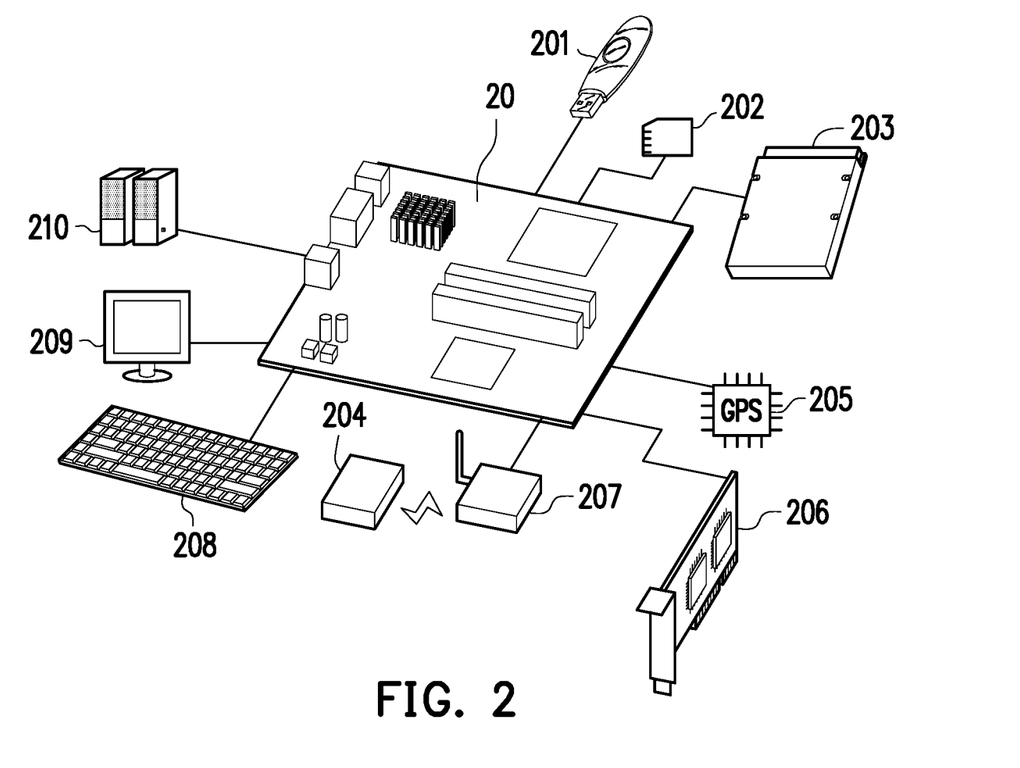
FIG. 2 is a schematic diagram illustrating a host system, a memory storage apparatus and an input/output (I/O) device according to another exemplary embodiment.

FIG. 1 is a schematic diagram illustrating a host system, a memory storage apparatus and an input/output (I/O) device according to an exemplary embodiment, and FIG. 2 is a schematic diagram illustrating a host system, a memory storage apparatus and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage apparatus 10 through the data transmission interface 114. For example, the host system 11 can write data into the memory storage apparatus 10 or read data from the memory storage apparatus 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In this exemplary embodiment, the processor 111, the RAM 112, the ROM 113 and the data transmission interface 114 may be disposed on a main board 20 of the host system 11. The number of the data transmission interfaces 114 may be one or more. Through the data transmission interface 114, the main board 20 may be coupled to the memory storage apparatus 10 in a wired manner or a wireless manner. The memory storage apparatus 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as an NFC (Near Field Communication) memory storage apparatus, a WiFi (Wireless Fidelity) memory storage apparatus, a Bluetooth™ memory storage apparatus, or a BLE (Bluetooth™ low energy) memory storage apparatus (e.g., iBeacon™). Further, the main board 20 may also be coupled to various I/O devices including a GPS (Global Positioning System) module 205, a network interface card (NIC) 206, a wireless transmission device 207, a keyboard 208, a monitor 209 and a speaker 210 through the system bus 110. For example, in an exemplary embodiment, the main board 20 can access the wireless memory storage apparatus 204 via the wireless transmission device 207.

Figure 3:
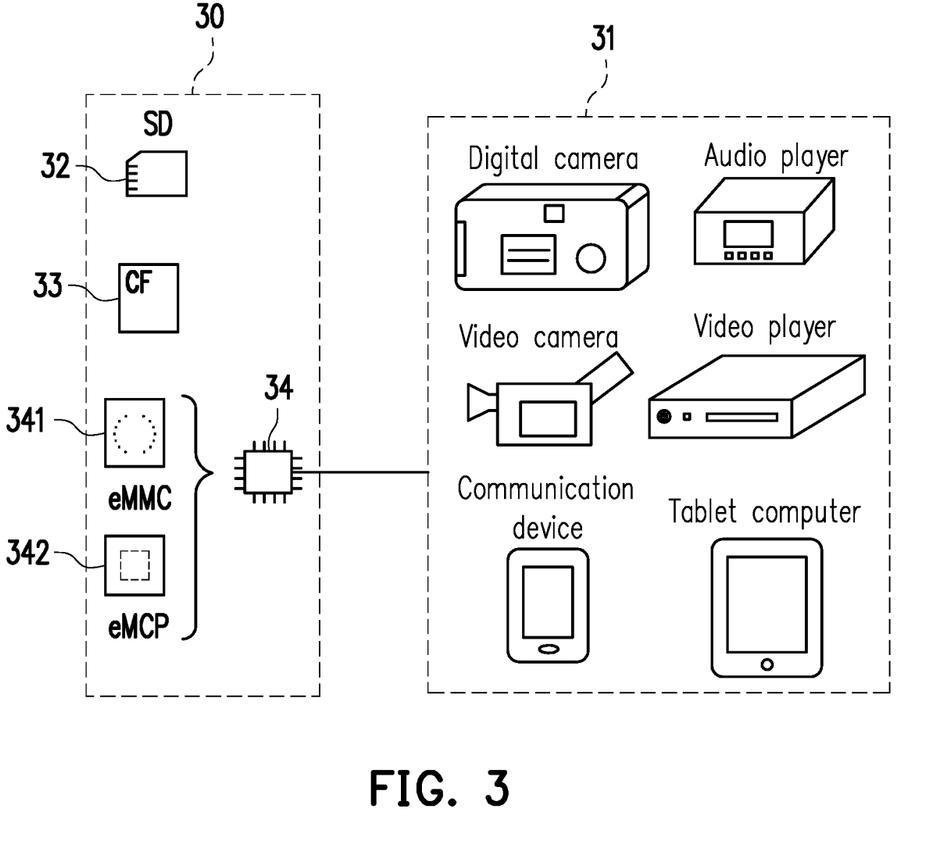
FIG. 3 is a schematic diagram illustrating a host system and a memory storage apparatus according to an exemplary embodiment.

In an exemplary embodiment, the aforementioned host system may be any system capable of substantially cooperating with the memory storage apparatus for storing data. Although the host system is illustrated as a computer system in the foregoing exemplary embodiment, the disclosure is not limited thereto. FIG. 3 is a schematic diagram illustrating a host system and a memory storage apparatus according to another exemplary embodiment. Referring to FIG. 3, in another exemplary embodiment, a host system 31 may be a system including a digital camera, a video camera, a communication device, an audio player, a video player or a tablet computer, whereas a memory storage apparatus 30 may be various non-volatile memory storage apparatuses used by the host system, such as a SD™ card 32, a CF™ card 33 or an embedded storage device 34. The embedded storage device 34 includes various embedded storage devices capable of directly coupling a memory module onto a substrate of the host system, such as an eMMC™ (embedded MMC™) 341 and/or an eMCP (embedded Multi Chip Package) 342.

Figure 4:
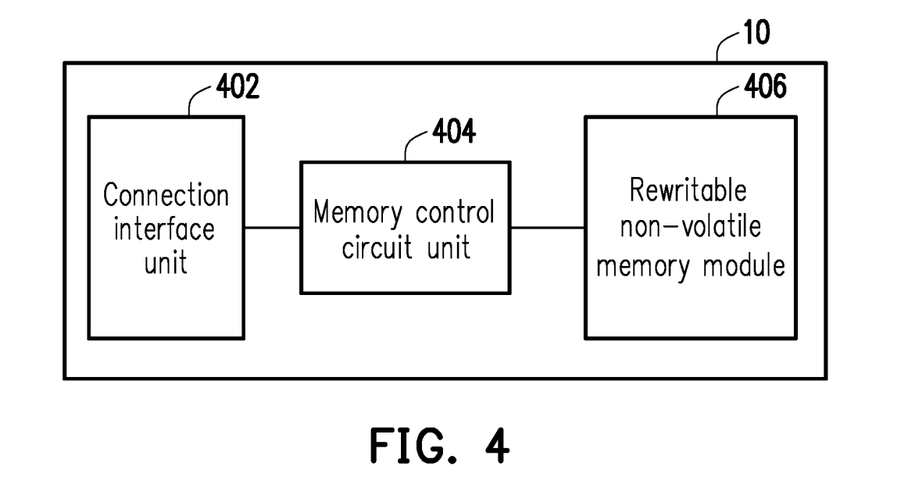
FIG. 4 is a schematic block diagram illustrating a host system and a memory storage apparatus according to another exemplary embodiment.

FIG. 4 is a schematic block diagram illustrating a host system and a memory storage apparatus according to one exemplary embodiment.

Referring to FIG. 4, the memory storage apparatus 10 includes a connection interface unit 402, a memory control circuit unit 404 and a rewritable non-volatile memory module 406.

In this exemplary embodiment, the connection interface unit 402 is compatible with a SD™ (Secure Digital) interface standard. Nevertheless, it should be understood that the invention is not limited to the above. The connection interface unit 402 may also be compatible with a SATA (Serial Advanced Technology Attachment) standard, a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a MS (Memory Stick)™ interface standard, a Multi-Chip Package (MCP) interface standard, a MMC™ (Multi Media Card) interface standard, an eMMC (Embedded Multi Media Card) interface standard, a UFS (Universal Flash Storage) interface standard, an eMCP (embedded Multi Chip Package) interface standard, a CF (Compact Flash)™ interface standard, an IDE (Integrated Device Electronics) interface standard or other suitable standards. In this exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to implement a plurality of logic gates or control commands in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory storage module 406 includes physical blocks (a.k.a. physical erasing units) 410

Figure 6:
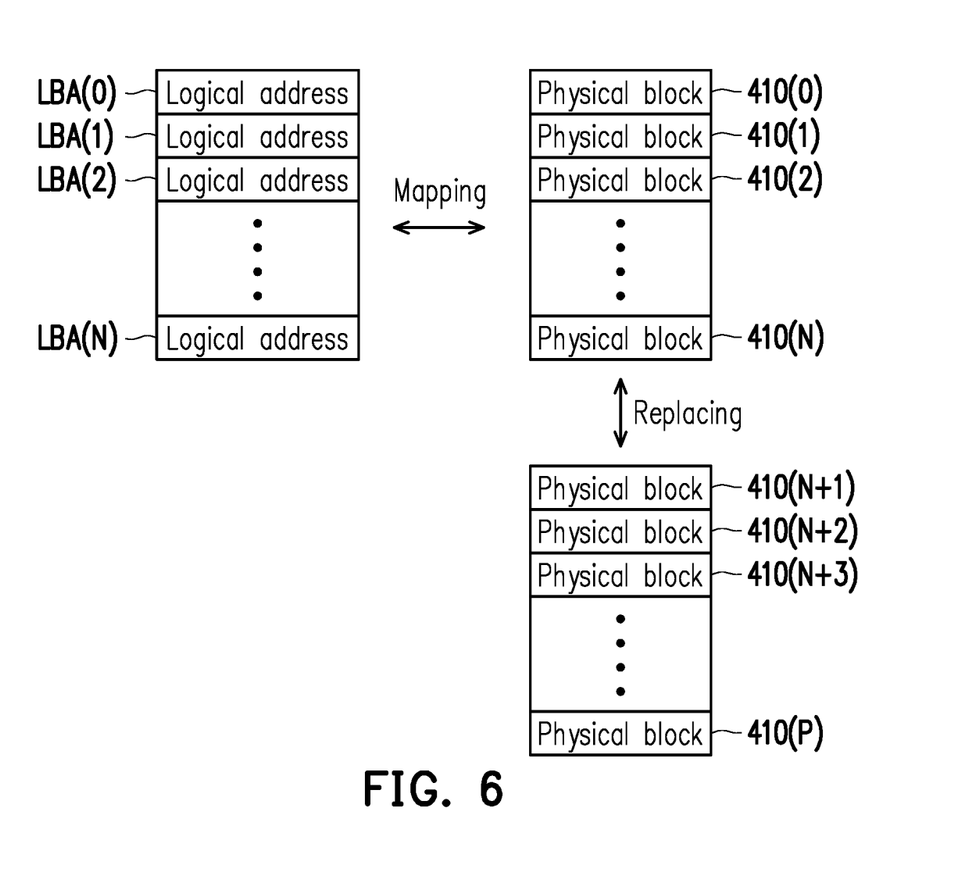
FIG. 6 is a schematic diagram illustrating a mapping between logical addresses and physical blocks during initialization according to an exemplary embodiment.

(0) to 410(P) (FIG. 6). For example, the physical blocks 410(0) to 410(P) may belong to the same memory die or belong to different memory dies. Each physical block has a plurality of physical pages (a.k.a. physical programming units), and the physical pages belonging to the same physical block may be written separately and erased simultaneously. Nevertheless, it should be understood that the invention is not limited to the above. Each physical block may be constituted by 64 pages, 256 physical pages or any number of the physical pages.

To be more specific, the physical block is the minimum unit for data erasing. That is to say, each of the physical blocks has a minimum number of memory cells for being erased together. The physical page is the minimum unit for programming. That is, the physical page is the minimum unit for writing data. Each of the physical pages usually includes a data bit area and a redundant bit area. The data bit area having multiple physical access addresses is used to store user data, and the redundant bit area is used to store system data (e.g., control information and error checking and correcting code). In this exemplary embodiment, each data bit area of the physical page contains 8 physical access addresses, and the size of each physical access address is 512 bytes. However, in other exemplary embodiments, the data bit area may also contain more or less physical access addresses, and the number and size of the physical access addresses are not limited by the invention. For example, in an exemplary embodiment, the physical block is the physical erasing unit and the physical programming unit is the physical erasing unit or a physical sector. However, the invention is not limited thereto.

In this exemplary embodiment, the rewritable non-volatile memory module 406 is a SLC (Single Level Cell) NAND flash memory module (i.e., a flash memory module capable of storing one data bit in one memory cell). However, the invention is not limited to the above. The rewritable non-volatile memory module 406 may also be a MLC (Multi Level Cell) NAND flash memory module, (i.e., a flash memory module capable of storing two data bits in one memory cell), a TLC (Ternary Level Cell) NAND flash memory module (i.e., a flash memory module capable of storing three data bits in one memory cell), other flash memory modules or any memory module having the same features.

Figure 5:
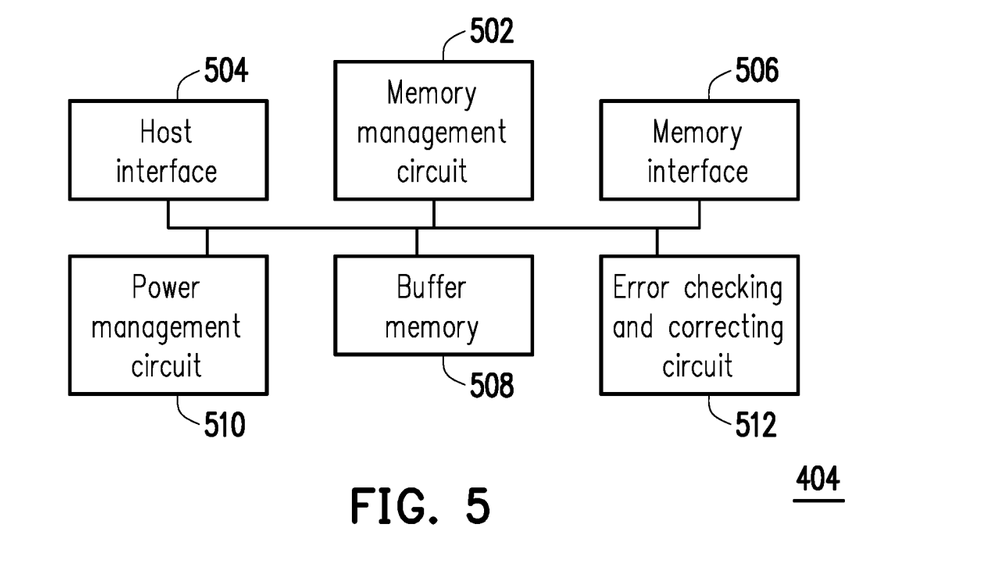
FIG. 5 is a schematic block diagram illustrating a memory control circuit unit according to an exemplary embodiment.

FIG. 5 is a schematic block diagram illustrating a memory control circuit unit according to an exemplary embodiment.

Referring to FIG. 5, the memory control circuit unit 404 includes a memory management circuit 502, a host interface 504 and a memory interface 506.

The memory management circuit 502 is configured to control overall operations of the memory control circuit unit 404. Specifically, the memory management circuit 502 stores a plurality of control commands. When the memory storage apparatus 10 operates, the control commands are executed to perform various operations such as data writing, data reading and data erasing.

In this exemplary embodiment, the control commands of the memory management circuit 502 are implemented in a firmware form. For instance, the memory management circuit 502 has a microprocessor unit (not illustrated) and a ROM (not illustrated), and the control commands are burned into the ROM. When the memory storage apparatus 10 operates, the control commands are executed by the microprocessor to perform operations of writing, reading or erasing data.

In another exemplary embodiment of the invention, the control commands of the memory management circuit 502 may also be stored, in the form of program codes, into a specific area (e.g., a system area in the memory module dedicated to store the system data) of the rewritable non-volatile memory module 406. In addition, the memory management circuit 502 has a microprocessor unit (not illustrated), a ROM (not illustrated) and a RAM (not illustrated). In particular, the ROM has an activate code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations of writing, reading or erasing data.

Further, in another exemplary embodiment of the invention, the control commands of the memory management circuit 502 may also be implemented in the form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical blocks of the rewritable non-volatile memory module 406; the memory writing circuit is configured to give a write command to the rewritable non-volatile memory module 406 in order to write data into the rewritable non-volatile memory module 406; the memory reading circuit is configured to give a read command to the rewritable non-volatile memory module 406 in order to read data from the rewritable non-volatile memory module 406; the memory erasing circuit is configured to give an erase command to the rewritable non-volatile memory module 406 in order to erase data from the rewritable non-volatile memory module 406; and the data processing circuit is configured to process both the data to be written into the rewritable non-volatile memory module 406 and the data read from the rewritable non-volatile memory module 406.

The host interface 504 is coupled to the memory management circuit 502 and configured to couple to the connection interface unit 402, so as to receive and identify commands and data sent from the host system 11. In other words, the commands and data transmitted by the host system 11 are transmitted to the memory management circuit 502 via the host interface 504. In this exemplary embodiment, the host interface 504 is compatible with the SATA standard. Nevertheless, it should be understood that the invention is not limited to the above. The host interface 504 may also be compatible with the PATA standard, the IEEE 1394 standard, the PCI Express standard, the USB standard, the UHS-I interface standard, the UHS-II interface standard, the SD standard, the MS standard, the MMC standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506.

In an exemplary embodiment, the memory control circuit unit 404 further includes a buffer memory 508, a power management circuit 510 and an error checking and correcting circuit 512.

The buffer memory 508 is coupled to the memory management circuit 502 and configured to temporarily store data and commands from the host system 11 or data from the rewritable non-volatile memory module 406.

The power management unit 510 is coupled to the memory management circuit 502 and configured to control a power of the memory storage apparatus 10.

The error checking and correcting circuit 512 is coupled to the memory management circuit 502 and configured to execute an error checking and correcting procedure to ensure data integrity. Specifically, when the memory management circuit 502 receives a write command from the host system 11, the error checking and correcting circuit 512 generates an ECC code (Error Checking and Correcting Code) for the data corresponding to the write command, and the memory management circuit 502 writes the data and the ECC code corresponding to the write command into the rewritable non-volatile memory module 406. Later, when reading the data from the rewritable non-volatile memory module 406, the memory management circuit 502 also reads the error checking and correcting code corresponding to the data, and the error checking and correcting circuit 512 executes the error checking and correcting procedure for the read data according to the error checking and correcting code.

In this exemplary embodiment, a low density parity code (LDPC) is implemented by the error checking and correcting circuit 512. However, in another exemplary embodiment, the error checking and correcting circuit 512 may also be implemented by encoding/decoding algorithms including a Bose-Chaudhuri-Hocquenghem (BCH) code, a convolutional code, a turbo code, a bit flipping, etc.

Specifically, the memory management circuit 502 generates an error correction code frame (ECC frame) according to the received data and the corresponding error checking and correcting code (a.k.a. an error correction code) and writes the ECC frame into the rewritable non-volatile memory module 406. Then, when the memory management circuit 502 reads data from the rewritable non-volatile memory module 406, the error checking and correcting circuit 512 can verify the correctness of the read data according to the error correction code in the ECC frame.

In the following description, the operations executed by the memory management circuit 502, the host interface 504, the memory interface 506, the buffer memory 508, the power management circuit 510 and the error checking and correcting circuit 512 may also be referred to as being executed by the memory control circuit unit 404.

FIG. 6 is a schematic diagram illustrating a mapping between logical addresses and physical blocks during initialization according to an exemplary embodiment.

It should be understood that terms like "group" are logical concepts which describe operations in the physical blocks of the rewritable non-volatile memory module 406. In other words, the physical blocks of the rewritable non-volatile memory module are logically operated, but actual positions of the physical blocks of the rewritable non-volatile memory module are not changed.

In general, before the memory storage apparatus 10 leaves the factory, manufacturers will perform a formatting operation for the memory storage apparatus 10 using a Mass Production tool (MP tool) so as to perform an initialization.

With reference to FIG. 6, for example, the memory management circuit 502 configures logical addresses LBA(0) to LBA(N) for mapping to the physical blocks 410(0) to 410(N). In an exemplary embodiment, the memory management circuit 502 retrieves the physical blocks to store a logical address-physical address mapping table which is recorded with a mapping relationship between the logical addresses LBA(0) to LBA(N) and the physical blocks 410(0) to 410(N).

Figure 7:
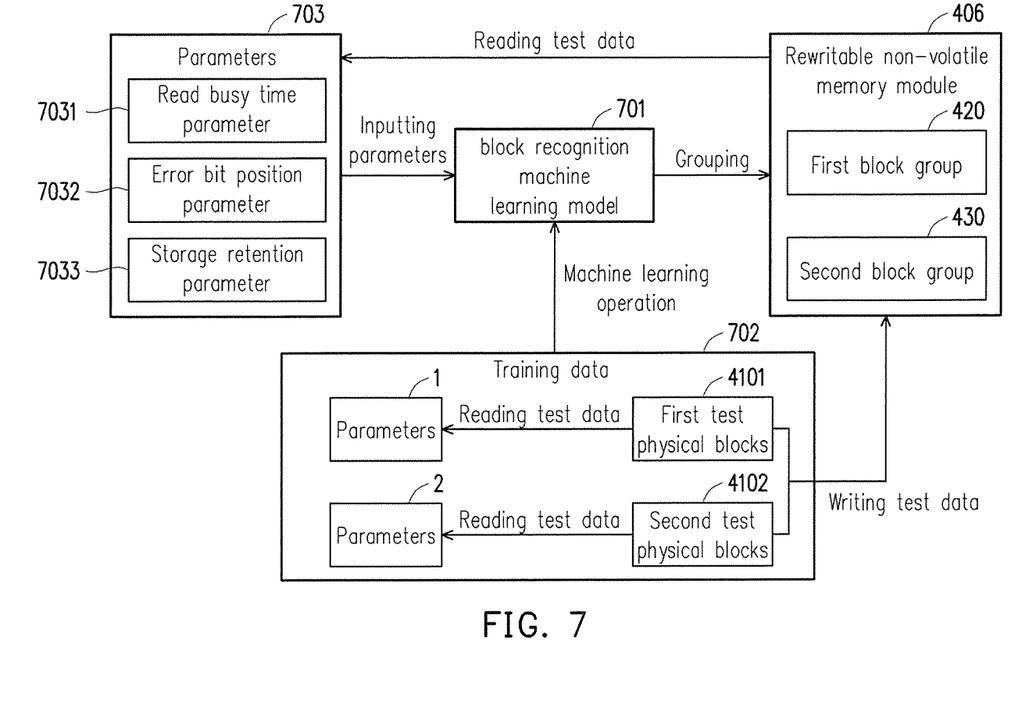
FIG. 7 is a schematic block diagram illustrating a block management performed by a block recognition machine learning model according to an exemplary embodiment.

FIG. 7 is a schematic block diagram illustrating a block management performed by a block recognition machine learning model according to an exemplary embodiment.

The following description refers to FIG. 7. In an exemplary embodiment, the memory management circuit 502 is configured to give a write command sequence for respectively writing test data into a plurality of first test physical blocks 4101 and a plurality of second test physical blocks 4102 of the rewritable non-volatile memory module 406, and gives a read command sequence for respectively reading the test data to obtain parameters 1 corresponding to the first test physical blocks 4101 and parameters 2 corresponding to the second test physical blocks. Also, the memory management circuit 502 performs a machine learning operation by using the first test physical blocks 4101, the parameters 1 corresponding to the first test physical blocks, the second test physical blocks 4102 and the parameters 2 corresponding to the second test physical blocks as training data 702 to train a block recognition machine learning model 701.

In an exemplary embodiment, the memory management circuit 502 writes the test data into the physical blocks 410(0) to 410(N) in the rewritable non-volatile memory module 406 to obtain a plurality of parameters 703 corresponding to the physical blocks 410(0) to 410(N), and per each of the physical blocks, inputs the parameters 703 corresponding to each of the physical blocks into the block recognition machine learning model 701 to group the physical blocks 410(0) to 410(N) in the rewritable non-volatile memory module 406 into at least a first block group 420 and a second block group 430 according to an output result of the block recognition machine learning model 701.

The parameters 703 corresponding to the physical blocks 410(0) to 410(N) are related to the wearing level of the physical block and other influences on its usage status. In this exemplary embodiment, the parameters 703 corresponding to the physical blocks 410(0) to 410(N) include, for example, a read busy time parameter 7031, an error bit position parameter 7032 and a storage retention parameter 7033. Herein, the error bit position parameter 7032 is obtained according to an error bits distribution in an upper physical programming unit, an error bits distribution in a center physical programming unit and an error bits distribution in a lower physical programming unit among test data read from each of the physical blocks 410(0) to 410(N).

Similarly, the parameters 1 corresponding to the first test physical blocks 4101 and the parameters 2 corresponding to the second test physical blocks 4102 also include the read busy time parameter, the error bit position parameter and the storage retention parameter.

Specifically, it is assumed that 1000 physical blocks in the rewritable non-volatile memory module 406 are used herein as samples. In this case, by writing the test data into the 1000 physical blocks serving as the samples and reading the test data, the parameters corresponding to each physical block among the 1000 physical blocks may be obtained. Then, these parameters and the 1000 physical blocks are used as the training data 702 of the block recognition machine learning model 701 so the machine learning may be performed to train the block recognition machine learning model 701. In particular, after the training data 702 is input into the block recognition machine learning model 701, the block recognition machine learning model 701 proceeds to learn and analyze the training data 702, retrieves features of the training data 702, and finds a rule between the parameters corresponding to each physical block and the 1000 physical blocks in order to construct at least two sets. Accordingly, the retrieved features and the found rule may be used for learning to determine the usage status of the physical block, and the 1000 physical blocks may be grouped into at least two block groups according to the at least two sets. In general, as the number of samples used as the training data increases, the block recognition machine learning model 701 is able to learn more so an accuracy of the block recognition machine learning model 701 may be further improved.

For instance, when one of the physical blocks serving as the sample receives commands for reading/writing the test data, the time for writing the test data into the physical block or reading the test data from the physical block is used as the read busy time parameter. If the time for writing the test data into the physical block or reading the test data from the physical block is longer than a predetermined time (i.e., the read busy time parameter of the physical block is greater than a predetermined read busy time parameter), the physical block serving as the sample may be classified as a physical block with the usage status being normal (or poor) and grouped into the second block group 430. In this case, the block recognition machine learning model 701 will perform the machine learning to retrieve the features of the read busy time parameter of the physical block serving as the sample, and analyze the rule between the read busy time parameter and grouping of the physical block. For example, afterward, the physical blocks have the same or similar the read busy time parameter which is greater than the predetermined read busy time parameter. The block recognition machine learning model 701 will classify those physical blocks into the second block group 430 with the usage status being normal (or poor).

The block recognition machine learning model 701 may also determine and group the physical blocks according to positions of the error bits occurring in the memory cells in the physical block. For instance, it is assumed that the rewritable non-volatile memory module 406 is a TLC (Ternary Level Cell) NAND flash memory module. In this case, by writing the test data into the physical block serving as the sample in the TLC NAND flash memory module and reading the test data from such physical block, the error bit position parameter corresponding to that physical block may be obtained. Here, the positions of the error bits occurring in the memory cells of such physical block include the error bits distribution in the upper physical programming unit, the error bits distribution in the center physical programming unit and the error bits distribution in the lower physical programming unit. The block recognition machine learning model 701 classifies the physical block into the group with the usage status being good or the group with the usage status as normal (poor) according to the error bit position parameter. For example, when the test data is being read from the physical block, if the test data is uncorrectable in an error checking and correcting operation and the correction may only completed by a re-reading operation by using a re-read voltage, this physical block will be classified into the group with the usage status being normal (or poor), and grouped into the second block group 430.

In other words, when the memory management circuit 502 reads the test data from the physical block by using a read voltage, if the test data cannot be read by using that read voltage, the memory management circuit 502 may adjust the read voltage and then perform a reading operation on the physical block again. If the test data may be read after performing the re-reading operation on the physical block by using the adjusted read voltage, and the positions of the error bits occurring in the physical block may be detected and corrected by the error checking and correcting operation, the physical block may still be used and have the usage status as normal (or poor). In other words, when the memory management circuit 502 reads the test data from the physical block by using the read voltage, if the test data may be corrected in the error checking and correcting operation, the physical block may be classified into the group with the usage status being good and grouped into the first block group 420. Similarly, the block recognition machine learning model 701 retrieves the features from the error bit position parameter of the physical block serving as the sample, analyzes the rule between the error bit position parameter and grouping of the physical block, and performs the machine learning.

In order to improve the accuracy of the block recognition machine learning model 701, the block recognition machine learning model 701 retrieves the features from all the parameters of the 1000 physical blocks served as the samples, performs the machine learning on the rule between the parameters and grouping of the physical blocks, so as to establish the block recognition machine learning model 701 capable of grouping the physical blocks 410(0) to 410(N) in the rewritable non-volatile memory module 406 with adequate accuracy after going through the machine learning.

Figure 8:
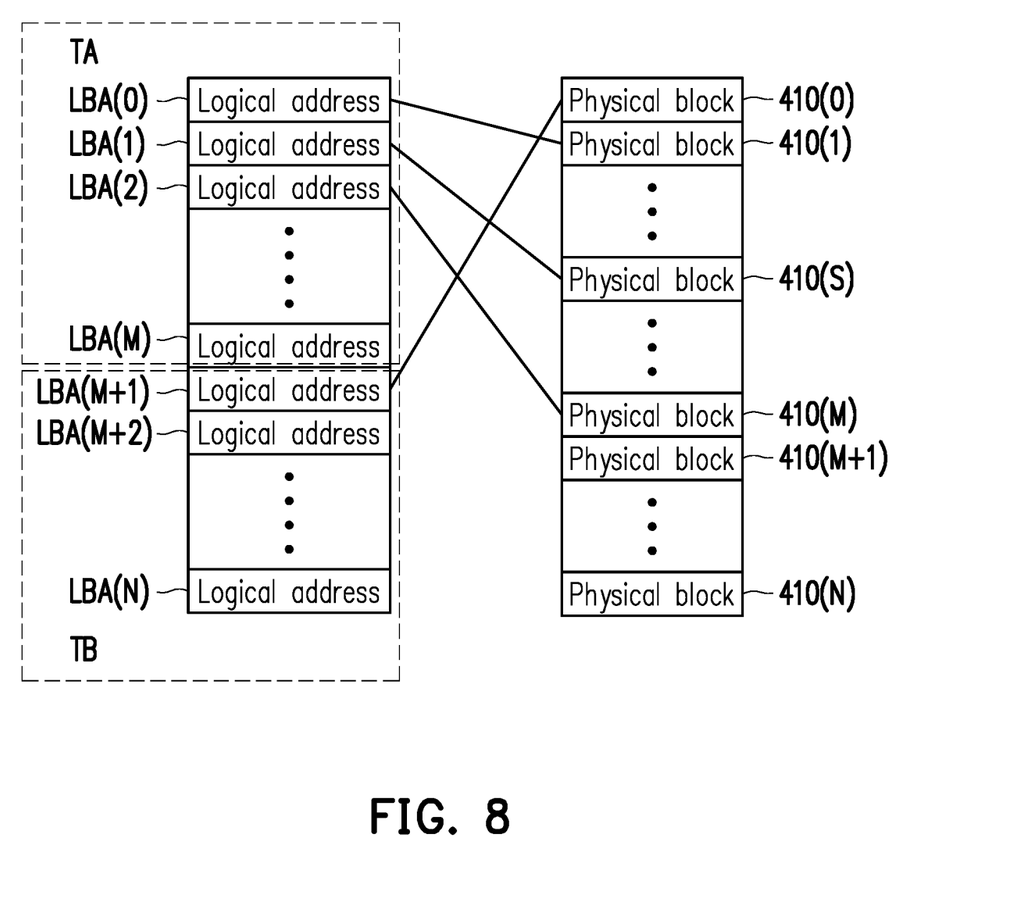
FIG. 8 is a schematic diagram illustrating a mapping between the physical blocks and the block mapping table according to an exemplary embodiment.

FIG. 8 is a schematic diagram illustrating a mapping between the physical blocks and the block mapping table according to an exemplary embodiment.

With reference to FIG. 8, the memory management circuit 502 establishes a first block mapping table TA and a second block mapping table TB. The first block mapping table TA includes the logical addresses LBA(0) to LBA(M), and the second block mapping table TB includes the logical addresses LBA(M+1) to LBA(N). In this exemplary embodiment, the logical addresses LBA(0) to LBA(M) of the first block mapping table TA are arranged in front of the logical addresses LBA(M+1) to LBA(N) of the second block mapping table TB. The physical blocks 410(0) to 410(N) in the rewritable non-volatile memory module 406 may be grouped by the block recognition machine learning model 701 into two groups having the usage status as good and the usage status as normal (or poor), which are the first block group 420 and the second block group 430. In an exemplary embodiment, the block recognition machine learning model 701 groups the physical blocks with the usage status as good into the first block group 420, and groups the physical blocks with the usage status as normal (or poor) into the second block group 430. The logical addresses LBA(0) to LBA(M) of the first block mapping table TA are mapped to the physical blocks belonging to the first block group 420, and the logical addresses LBA(M+1) to LBA(N) of the second block mapping table TB are mapped to the physical blocks belonging to the second block group 430.

For example, in an exemplary embodiment, the memory management circuit 502 stores data with a higher overwrite frequency at the logical addresses LBA(0) to LBA(M) of the first block mapping table TA, and stores data with a lower overwrite frequency at the logical addresses LBA(M+1) to LBA(N) of the second block mapping table TB. In general, the memory management circuit 502 first selects and uses the physical blocks with the logical address arranged at the front. In other words, the memory management circuit 502 first selects and uses the mapped physical blocks belonging to the first block group 420.

With reference to FIG. 8, the memory management circuit 502 searches for the physical block 410(0) from the physical blocks 410(0) to 410(N) in the rewritable non-volatile memory module 406. Then, after giving the write command sequence for writing the test data into the physical block 410(0) and giving the read command sequence for reading the test data from the physical block 410(0) to obtain the read busy time parameter, the error bit position parameter and the storage retention parameter corresponding to the physical block 410(0), the memory management circuit 502 inputs the parameters into the block recognition machine learning model 701 so the block recognition machine learning model 701 can group the physical block 410(0) according to the parameters. For instance, if the block recognition machine learning model 701 groups the physical block 410(0) into the second block group 430 with the usage status as normal (or poor) according to the rule between the parameters of the physical block 410(0) and grouping, the physical block 410(0) will be mapped to the logical address LBA(M+1) in the second block mapping table TB.

Similarly, the memory management circuit 502 continues to search for the physical block 410(1) from the physical blocks 410(0) to 410(N) in the rewritable non-volatile memory module 406. Then, after giving the write command sequence for writing the test data into the physical block 410(1) and giving the read command sequence for reading the test data from the physical block 410(1) to obtain the parameters corresponding to the physical block 410(1), the memory management circuit 502 inputs the parameters into the block recognition machine learning model 701. If the block recognition machine learning model 701 learns to group the physical block 410(1) into the first block group 420 with the usage status as good according to the rule between the parameters and grouping, the physical block 410(1) will be mapped to the logical address LBA(0) in the first block mapping table TA.

The memory management circuit 502 continues to search for the physical block 410(S) from the physical blocks 410(0) to 410(N) in the rewritable non-volatile memory module 406. Then, after giving the write command sequence for writing the test data into the physical block 410(S) and giving the read command sequence for reading the test data to obtain the parameters corresponding to the physical block 410(S), the memory management circuit 502 inputs the parameters into the block recognition machine learning model 701. If the block recognition machine learning model 701 learns to group the physical block 410(S) into the first block group 420 with the usage status being better according to the rule between the parameters and grouping, the physical block 410(S) will be mapped to the logical address LBA(1) in the first block mapping table TA.

The memory management circuit 502 continues to search for the physical block 410(M) from the physical blocks 410(0) to 410(N) in the rewritable non-volatile memory module 406. Then, after giving the write command sequence for writing the test data into the physical block 410(M) and giving the read command sequence for reading the test data to obtain the parameters corresponding to the physical block 410(M), the memory management circuit 502 inputs the parameters into the block recognition machine learning model 701. If the block recognition machine learning model 701 learns to group the physical block 410(M) into the first block group 420 with the usage status being better according to the rule between the parameters and grouping, the physical block 410(M) will be mapped to the logical address LBA(2) in the first block mapping table TA.

More specifically, before the logical address LBA(2) of the first block mapping table TA is mapped to the physical block belonging to the first block group 420, the physical blocks belonging to the first block group 420 will be sorted according to the output result of the block recognition machine learning model 701. In other words, the physical blocks 410(0) and 410(S) belonging to the first block group 420 are sorted before the logical address LBA(2) of the first block mapping table TA is mapped to the physical block 410(M).

Similarly, before the logical addresses LBA(M+1) to LBA(N) of the second block mapping table TB are mapped to the physical blocks belonging to the second block group 430, the physical blocks belonging to the second block group 430 will be sorted according to the output result of the block recognition machine learning model 701.

In an exemplary embodiment, if it is required to re-group the physical block 410(S) among the physical blocks 410(0) to 410(N) in the rewritable non-volatile memory module 406, user data may be read from the physical block 410(S) to obtain a plurality of parameters corresponding to the physical block 410(S), and these parameters may then be input into the block recognition machine learning model 701 so the physical block 410(S) may be re-grouped into the first block group 420 or the second block group 430 according to another output result of the block recognition machine learning model 701.

Figure 9:
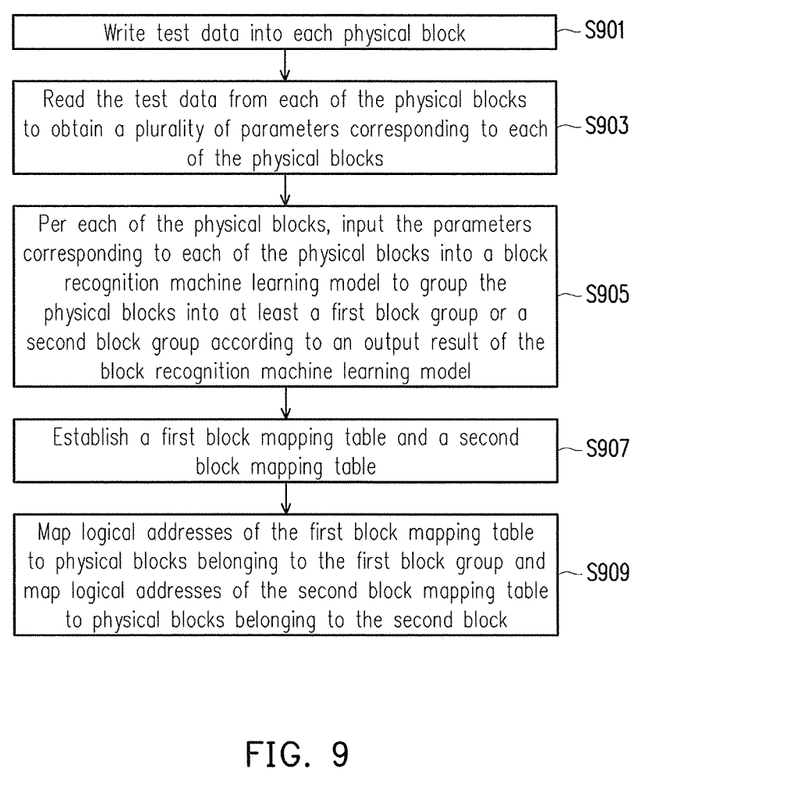
FIG. 9 is a flowchart illustrating a block management method according to an exemplary embodiment.

FIG. 9 is a flowchart illustrating a block management method according to an exemplary embodiment.

The following description refers to FIG. 9. In step S901, the memory management circuit 502 writes test data into each physical block.

In step S903, the memory management circuit 502 reads the test data from each of the physical blocks to obtain a plurality of parameters corresponding to each of the physical blocks.

In step S905, per each of the physical blocks, the memory management circuit 502 inputs the parameters corresponding to each of the physical blocks into a block recognition machine learning model to group the physical blocks into at least a first block group or a second block group according to an output result of the block recognition machine learning model.

In step S907, the memory management circuit 502 establishes a first block mapping table and a second block mapping table.

In step S909, the memory management circuit 502 maps logical addresses of the first block mapping table to the physical blocks belonging to the first block group and maps logical addresses of the second block mapping table to the physical blocks belonging to the second block group.

Figure 10:
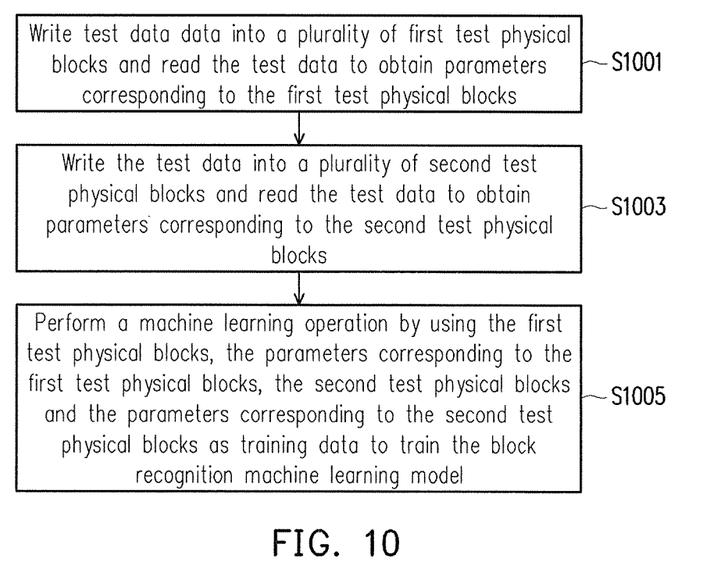
FIG. 10 is a flowchart illustrating a method for establishing the block recognition machine learning model according to an exemplary embodiment.

FIG. 10 is a flowchart illustrating a method for establishing the block recognition machine learning model according to an exemplary embodiment.

With reference to FIG. 10, step S1001 is further included before the step in which the memory management circuit 502 writes the test data into each of the physical blocks. In step S1001, the memory management circuit 502 gives a write command sequence for writing the test data into a plurality of first test physical blocks and gives a read command sequence for reading the test data to obtain parameters corresponding to the first test physical blocks.

In step S1003, the memory management circuit 502 gives the write command sequence for writing the test data into a plurality of second test physical blocks and gives the read command sequence for reading the test data to obtain parameters corresponding to the second test physical blocks.

In step S1005, the memory management circuit 502 performs a machine learning operation by using the first test physical blocks, the parameters corresponding to the first test physical blocks, the second test physical blocks and the parameters corresponding to the second test physical blocks as training data to train the block recognition machine learning model.

Figure 11:
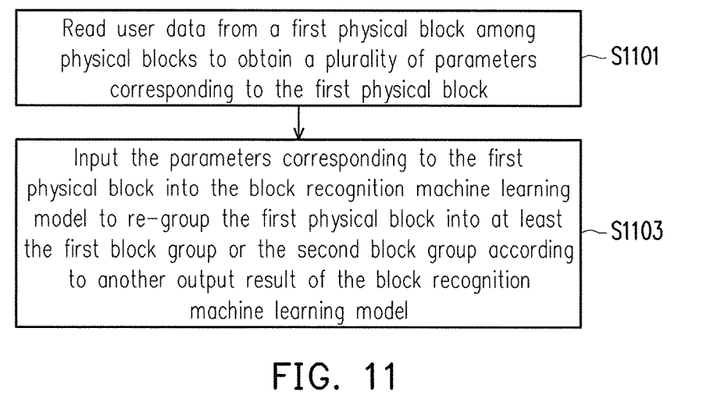
FIG. 11 is a flowchart illustrating a method for re-grouping the physical blocks according to an exemplary embodiment.

FIG. 11 is a flowchart illustrating a method for re-grouping the physical blocks according to an exemplary embodiment.

With reference to FIG. 11, in step S101, the memory management circuit 502 gives a read command sequence for reading user data from a first physical block among the physical blocks to obtain a plurality of parameters corresponding to the first physical block.

In step S1103, the parameters corresponding to the first physical block are input into the block recognition machine learning model to re-group the first physical block into at least the first block group or the second block group according to another output result of the block recognition machine learning model.

In summary, the block recognition machine learning model of the invention can determine the usage status of a physical block according to the parameters of the physical block, and group the physical blocks accordingly. Moreover, the logical addresses arranged at the front of the block mapping table may be mapped to the physical blocks with the usage status being good for writing data with the higher overwrite frequency (e.g., the system data) first, whereas the logical addresses arranged at the back of the block mapping table may be mapped to the physical blocks with the usage status being normal (or poor) for writing data with the lower overwrite frequency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A block management method for managing a plurality of physical blocks in a rewritable non-volatile memory module, the block management method comprising:
   writing test data to a first physical block among the plurality of physical blocks;
   reading the test data from the first physical block among the plurality of physical blocks to obtain a plurality of parameters corresponding to the first physical block;
   grouping the first physical block into a first block group or a second block group according to the plurality of parameters corresponding to the first physical block and a rule between the plurality of parameters and grouping of the plurality of physical blocks;
   establishing a first block mapping table and a second block mapping table;
   sorting physical blocks belonging to the first block group;
   mapping logical addresses of the first block mapping table to the physical blocks belonging to the first block group;
   sorting physical blocks belonging to the second block group; and
   mapping logical addresses of the second block mapping table to the physical blocks belonging to the second block group,
   wherein the plurality of parameters comprises a bit error position parameter that is obtained according to an error bits distribution in an upper physical programming unit, an error bits distribution in a center physical programming unit and an error bits distribution in a lower physical programming unit among test data read from each of the plurality of physical blocks, and the rule between the plurality of parameters and the grouping of the plurality of physical blocks comprises:
   grouping a physical block of the plurality of physical blocks into the first block group when test data read from the physical block is correctable in an error checking and correcting operation, and
   grouping a further physical block of the plurality of physical blocks into the second block group when further test data read from the further physical block is uncorrectable in the error checking and correcting operation and is corrected after a re-reading operation.

2. The block management method of claim 1, wherein the logical addresses of the first block mapping table are arranged in front of the logical addresses of the second block mapping table.

3. The block management method of claim 2, wherein an overwrite frequency of data stored at the logical addresses of the first block mapping table is higher than an overwrite frequency of data stored at the logical addresses of the second block mapping table.

4. The block management method of claim 1, wherein the parameters further comprise at least one of a read busy time parameter.

5. The block management method of claim 1, further comprising:
   grouping the first physical block into the second block group when the test data read from the first physical block is uncorrectable in an error checking and correcting operation and is corrected after a re-reading operation.

6. The block management method of claim 1, wherein sorting the physical blocks belonging to the first block group comprises:
   sorting the physical blocks belonging to the first block group according to the rule before mapping the logical addresses of the first block mapping table to the physical blocks belonging to the first block group.

7. A memory storage apparatus, comprising:
   a connection interface unit, configured to electrically connect to a host system;
   a rewritable non-volatile memory module comprising a plurality of physical blocks; and
   a memory control circuit unit, electrically connected to the connection interface unit and the rewritable non-volatile memory module, wherein the memory control circuit unit is configured to:
   give a write command sequence for writing test data to a first physical block among the plurality of physical blocks;
   give a read command sequence for reading the test data from the first physical block among the plurality of physical blocks to obtain a plurality of parameters corresponding to the first physical block;
   group the first physical block into a first block group or a second block group according to the plurality of parameters corresponding to the first physical block and a rule between the plurality of parameters and grouping of the plurality of physical blocks;
   establish a first block mapping table and a second block mapping table;
   sort physical blocks belonging to the first block group;

map logical addresses of the first block mapping table to the physical blocks belonging to the first block group;

sort physical blocks belonging to the second block group;

map logical addresses of the second block mapping table to the physical blocks belonging to the second block group, wherein the plurality of parameters comprises a bit error position parameter that is obtained according to an error bits distribution in an upper physical programming unit, an error bits distribution in a center physical programming unit and an error bits distribution in a lower physical programming unit among test data read from each of the plurality of physical blocks, and the rule between the plurality of parameters and the grouping of the plurality of physical blocks comprises:

grouping a physical block of the plurality of physical blocks into the first block group when test data read from the physical block is correctable in an error checking and correcting operation, and grouping a further physical block of the plurality of physical blocks into the second block group when further test data read from the further physical block is uncorrectable in the error checking and correcting operation and is corrected after a re-reading operation.

8. The memory storage apparatus of claim 7, wherein the memory control circuit unit is configured to arrange the logical addresses of the first block mapping table in front of the logical addresses of the second block mapping table.

9. The memory storage apparatus of claim 8, wherein an overwrite frequency of data stored at the logical addresses of the first block mapping table by the memory control circuit unit is higher than an overwrite frequency of data stored at the logical addresses of the second block mapping table by the memory control circuit unit.

10. The memory storage apparatus of claim 7, wherein the parameters further comprise at least one of a read busy time parameter and a storage retention parameter.

11. The memory storage apparatus of claim 7, wherein the memory control circuit unit is configured to group the first physical block into the second block group when the test data read from the first physical block is uncorrectable in an error checking and correcting operation and is corrected after a re-reading operation.

12. The memory storage apparatus of claim 7, wherein the memory control circuit unit is further configured to sort the physical blocks belonging to the first block group according to the rule before mapping the logical addresses of the first block mapping table to the physical blocks belonging to the first block group.

13. A memory control circuit unit, the memory control circuit unit comprising:

a host interface, configured to electrically connect to a host system;

a memory interface, configured to electrically connect to a rewritable non-volatile memory module, wherein the rewritable non-volatile memory module comprises a plurality of physical blocks; and a memory management circuit, electrically connected to the host interface and the memory interface, wherein the memory management circuit is configured to:

give a write command sequence for writing test data to a first physical block among the plurality of physical blocks;

give a read command sequence for reading the test data from the first physical block among the plurality of physical blocks to obtain a plurality of parameters corresponding to the first physical block;

group the first physical block into a first block group or a second block group according the plurality of parameters corresponding to the first physical block and a rule between the plurality of parameters and grouping of the plurality of physical blocks;

establish a first block mapping table and a second block mapping table;

sort physical blocks belonging to the first block group;

map logical addresses of the first block mapping table to the physical blocks belonging to the first block group;

sort physical blocks belonging to the second block group;

map logical addresses of the second block mapping table to the physical blocks belonging to the second block group, wherein the plurality of parameters comprises a bit error position parameter that is obtained according to an error bits distribution in an upper physical programming unit, an error bits distribution in a center physical programming unit and an error bits distribution in a lower physical programming unit among test data read from each of the plurality of physical blocks, and the rule between the plurality of parameters and the grouping of the plurality of physical blocks comprises:

grouping a physical block of the plurality of physical blocks into the first block group when test data read from the physical block is correctable in an error checking and correcting operation, and grouping a further physical block of the plurality of physical blocks into the second block group when further test data read from the further physical block is uncorrectable in the error checking and correcting operation and is corrected after a re-reading operation.

14. The memory control circuit unit of claim 13, wherein the memory management circuit is configured to arrange the logical addresses of the first block mapping table in front of the logical addresses of the second block mapping table.

15. The memory control circuit unit of claim 14, wherein an overwrite frequency of data stored at the logical addresses of the first block mapping table by the memory management circuit is higher than an overwrite frequency of data stored at the logical addresses of the second block mapping table by the memory management circuit.

16. The memory control circuit unit of claim 13, wherein the parameters further comprise at least one of a read busy time parameter and a storage retention parameter.

17. The memory control circuit unit of claim 13, wherein the memory management circuit is configured to group the first physical block into the second block group when the test data read from the first physical block is uncorrectable in an error checking and correcting operation and is corrected after a re-reading operation.

18. The memory control circuit unit of claim 13, wherein the memory management circuit is further configured to sort the physical blocks belonging to the first block group according to the rule before mapping the logical addresses of the first block mapping table to the physical blocks belonging to the first block group.

* * * * *